United States Patent
Singhal et al.

(10) Patent No.: US 7,327,001 B1
(45) Date of Patent: Feb. 5, 2008

(54) PMOS TRANSISTOR WITH COMPRESSIVE DIELECTRIC CAPPING LAYER

(75) Inventors: Akhil Singhal, Beaverton, OR (US); James S. Sims, Tigard, OR (US); Bhadri N. Varadarajan, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/731,265

(22) Filed: Mar. 29, 2007

Related U.S. Application Data (62) Division of application No. 11/124,443, filed on May 6, 2005, now Pat. No. 7,214,630.

(51) Int. Cl.
*H01L 29/76* (2006.01)

(52) U.S. Cl. .............. 257/377; 257/382; 257/E29.156; 257/E29.161

(58) Field of Classification Search ........... 257/213, 257/268, 288, 412, 413, 456, E29.156; 438/758, 438/761, 778, 783, 791, 792; 427/E29.161, 427/563, 568, 578, 579
See application file for complete search history.

(56) References Cited

U.S. PATENT DOCUMENTS

| | | | |
|---|---|---|---|
| 4,923,822 A * | 5/1990 | Wang et al. ............ | 438/297 |
| 6,329,276 B1 * | 12/2001 | Ku et al. .............. | 438/586 |
| 6,855,645 B2 * | 2/2005 | Tang et al. ............ | 438/778 |
| 2003/0072975 A1 * | 4/2003 | Shero et al. ........... | 428/704 |

* cited by examiner

*Primary Examiner*—Brook Kebede
(74) *Attorney, Agent, or Firm*—Thomas Swenson

(57) ABSTRACT

A salicide layer is deposited on the source/drain regions of a PMOS transistor. A dielectric capping layer having residual compressive stress is formed on the salicide layer by depositing a plurality of PECVD dielectric sublayers and plasma-treating each sublayer. Compressive stress from the dielectric capping layer is uniaxially transferred to the PMOS channel through the source-drain regions to create compressive strain in the PMOS channel. To form a compressive dielectric layer, a deposition reactant mixture containing A1 atoms and A2 atoms is provided in a vacuum chamber. Element A2 is more electronegative than element A1, and A1 atoms have a positive oxidation state and A2 atoms have a negative oxidation state when A1 atoms are bonded with A2 atoms. A deposition plasma is generated by applying HF and LF radio-frequency power to the deposition reactant mixture, and a sublayer of compressive dielectric material is deposited. A post-treatment plasma is generated by applying HF and LF radio-frequency power to a post-treatment gas that does not contain at least one of A1 atoms and A2 atoms. Compressive stress in the dielectric sublayer is increased by treating the sublayer in the post-treatment plasma. Processes of depositing a dielectric sublayer and post-treating the sublayer in plasma are repeated until a desired thickness is achieved. The resulting dielectric layer has residual compressive stress.

24 Claims, 6 Drawing Sheets

PMOS TRANSISTOR WITH COMPRESSIVE DIELECTRIC CAPPING LAYER

RELATED APPLICATIONS

This application is a divisional application, claiming priority under 35 USC §§ 120 and 121 and 37 CFR 1.53(b) of co-owned U.S. patent application Ser. No. 11/124,443, filed May 6, 2005 now U.S. Pat. No. 7,214,630, by Varadarajan et al.

FIELD OF THE INVENTION

The invention is related to the field of integrated circuit transistors, in particular to methods and structures for providing increased mobility of holes in PMOS transistors.

BACKGROUND OF THE INVENTION

As the design density of integrated circuits increases, and design features get smaller, there is a need for higher switching speeds in transistors.

In un-strained silicon, the lowest energy level in the conduction band has six discrete electron states. Each state has a different momentum value, and only a small input of energy is required for an electron to move from one state to another. When the lattice is under tensile strain, its physical symmetry is broken, and with that the electronic symmetry. The lowest energy level of the conduction band is split, with two of the six original states dropping to a lower energy level and four rising to a higher energy level. Thus, it becomes more difficult for the electrons to be 'scattered' between the lowest energy states by a phonon, because there are only two states to occupy.

When electrons scatter, their motion is randomized. Reducing scatter increases the average distance an electron can travel before it is knocked off course, thus increasing its average velocity in the conduction direction. Also, distorting the lattice through tensile strain can distort the electron-lattice interaction in a way that reduces an electron's effective mass. An electron's effective mass governs its acceleration in an applied electric field.

The application of stress lifts the degeneracy between light and heavy-hole bands. In addition, the spin-orbit band is lowered in energy with respect to the other two bands. Due to this, the interband and intraband scatterings are reduced, which results in a significant improvement in hole mobility. Both tensile and compressive strain increase hole mobility compared to unstrained silicon, but the increase is lower for a tensile strain. This is because of the bigger intraband scattering rate for tensile strain. This higher scattering rate in the tensile situation can be understood considering that the density of states in the heavy hole band in the tensile case is larger than in the compressive case. J. E. Dijkstra et al., Journal of Applied Physics, vol 81, 1259 (1997); D. K. Nayak et al., Applied Physics Letters, vol 64, 6663 (2000).

U.S. Pat. No. 6,573,172, issued Jun. 3, 2003, to En et al., teaches forming a PECVD silicon nitride layer having a compressive stress on the gate electrode region and the source/drain regions to impart a tensile stress in an underlying channel of a NMOS transistor.

In the case of a PMOS device, the hole mobility of strained silicon (Si) has been shown to have higher mobility compared to that of unstrained Si. U.S. Pat. No. 6,621,131, issued Sep. 16, 2003, to Murthy et al., teaches depositing source and drain films containing an alloy of silicon and germanium. The inclusion of germanium results in compressive stress in a channel of a PMOS transistor. U.S. Pat. No. 6,046,494, issued Apr. 4, 2000, to Brigham et al., teaches formation of a conformal blanket silicon nitride layer on the silicide layer of a PMOS transistor. Brigham et al. teach that the residual tensile stress of the conformal silicon nitride layer results in a compressive stress being applied to the layers below the nitride layer, resulting in improved interfacial characteristics at the oxide—silicon interface. U.S. Pat. No. 6,573,172, issued Jun. 3, 2003, to En et al., teaches forming a conformal PECVD silicon nitride layer having a tensile stress on the gate electrode region and the source/drain regions to impart a compressive stress in an underlying channel of a PMOS transistor.

There is a need for methods and structures to increase compressive strain in the channel region of a PMOS transistor and thereby to promote higher hole mobilities, which increase transistor drain current and device performance.

SUMMARY OF THE INVENTION

The invention helps to solve some of the problems mentioned above by providing systems, structures and methods for generating compressive stress in the channel region of a PMOS transistor. Embodiments in accordance with the invention provide transistor architectures and fabrication processes for generating channel strain without adversely impacting the efficiency of the transistor fabrication process, while preserving the material quality and enhancing the performance of the resulting transistor. Transistor strain is generated in PMOS devices using a highly compressive post-salicide dielectric capping layer on the source and drain regions, which is deposited using a PECVD process, preferably at a temperature not exceeding 425° C. The stress from this capping layer is uniaxially transferred to the PMOS channel through the source-drain regions to create compressive strain in the PMOS channel.

Embodiments in accordance with the invention for making a thin film of highly-compressive dielectric material involve depositing dielectric material, and then conducting a post-treatment of the dielectric material in a plasma containing atomic-peening species. The high-energy atomic-peening species generated by the plasma strike the surface of deposited material, thereby compressing the material. Preferably, some of the excited peening atoms are also incorporated in the dielectric material, causing the dielectric material to compact and thereby increasing its compressive stress. Thus, ion bombardment arising from HFRF and LFRF energy during both deposition and post-treatment results in a film with a relatively high compressive stress.

Generally, embodiments in accordance with the invention involve depositing a plurality of thin sublayers of dielectric material. Preferred embodiments include depositing a thin sublayer of dielectric material, and conducting a short post-treatment of the sublayer in a plasma containing atomic-peening species before depositing the next sublayer. The compression of ion bombardment during plasma-post-treatment increases the compressive stress of the sublayer. Some of the high-energy atomic-peening species generated by the plasma are incorporated in each successive sublayer, resulting in highly compressive stress in the final layer of dielectric material. Compressive stress values of approximately $-2.1 \times 10^{10}$ dynes/cm$^2$ have been measured in exemplary SiN layers made in accordance with the invention.

A basic embodiment of a method of fabricating a PMOS transistor in accordance with the invention comprises processes of: (a) providing a PMOS transistor structure on a substrate comprising an n-doped well, a gate dielectric, a conductive gate electrode, p-doped source and drain regions on either side of the gate, and a channel underlying the gate; (b) forming a salicide layer covering the source and drain regions; (c) providing in a vacuum chamber a deposition reactant mixture comprising A1 atoms of a chemical element A1 and A2 atoms of a chemical element A2, wherein the element A2 is more electronegative than the element A1, and wherein the A1 atoms have a positive oxidation state and the A2 atoms have a negative oxidation state when A1 atoms are bonded with A2 atoms; (d) applying high-frequency (HF) and low-frequency (LF) power to the deposition reactant mixture to generate a deposition plasma containing excited A1-species and excited A2-species; (e) depositing a dielectric sublayer using the deposition plasma above the salicide layer covering the source and drain regions; (f) providing a post-treatment gas containing hydrogen atoms to a vacuum chamber, the post-treatment gas being substantially free of A1 atoms; (g) applying HF and LF power to the post-treatment gas to generate a post-treatment plasma, the post-treatment plasma comprising an excited hydrogen species, and the post-treatment plasma being substantially free of A1 atoms; (h) post-treating the dielectric sublayer in the post-treatment plasma; and (i) repeating the processes (e) and (h) of depositing a dielectric sublayer and post-treating the dielectric sublayer until a desired thickness of a dielectric material is achieved to form a dielectric capping layer having compressive stress on the salicide layer covering the source and drain regions. Generally, the LF power is greater than the HF power. Examples of A1-type elements include silicon (Si), boron (B), and carbon (C). Examples of A2-type elements include nitrogen (N), carbon (C), and oxygen (O). Examples of suitable dielectric materials include silicon nitride, silicon carbide, nitrogen-doped silicon carbide, boron nitride, silicon boron nitride, boron carbide, silicon boron carbide, carbon nitride, silicon oxide, and oxygen-doped silicon carbide. In an exemplary deposition mixture for forming compressive silicon nitride (SiN), the A1 atoms comprise silicon, and the A2 atoms comprise nitrogen. A post-treatment gas mixture for plasma-treating a SiN sublayer typically includes hydrogen atoms and an inert gas.

Methods in accordance with the invention are generally useful for forming a highly compressive dielectric layer on an integrated circuit substrate. Methods in accordance with the invention are also generally useful for incorporating so-called "implant atoms" in a thin film of an integrated circuit substrate.

A basic embodiment of a method of fabricating a thin film of integrated circuit material in accordance with the invention comprises processes of: (a) providing in a vacuum chamber a deposition reactant mixture comprising A1 atoms of a chemical element A1 and A2 atoms of a chemical element A2, wherein the element A2 is more electronegative than the element A1, and wherein the A1 atoms have a positive oxidation state and the A2 atoms have a negative oxidation state when A1 atoms are bonded with A2 atoms; (b) applying high-frequency (HF) and low-frequency (LF) power to the deposition reactant mixture to generate a deposition plasma containing excited A1-species and excited A2-species; (c) depositing a sublayer on the substrate using the deposition plasma; (d) providing a post-treatment gas containing peening species to a vacuum chamber, the post-treatment gas being substantially free of at least one type of atoms selected from the group consisting of A1-type atoms and A2-type atoms; (e) applying HF and LF power to the post-treatment gas to generate a post-treatment plasma, the post-treatment plasma comprising excited peening species, and the post-treatment plasma being substantially free of at least one type of atoms selected from the group consisting of A1-type atoms and A2-type atoms; (f) post-treating the sublayer in the post-treatment plasma; and (g) repeating the processes (c) and (f) of depositing a sublayer and post-treating the sublayer until a desired thickness of a thin film of material is achieved.

Examples of A1-type elements include silicon (Si), boron (B), and carbon (C). Examples of A2-type elements include nitrogen (N), carbon (C), and oxygen (O). Examples of silicon-containing species are tetramethylsilane, tetraethylsilane, and silane. An example of a nitrogen-containing species is ammonia ($NH_3$). A post-treatment mixture in accordance with the invention includes peening species, which are energized in the post-treatment plasma and bombard the deposited sublayer. A feature of a post-treatment mixture is that it is substantially non-film-forming. In other words, a post-treatment mixture does not contain all of the species necessary for forming additional material on the substrate. As a result, a post-treatment plasma does not result in formation of additional material. Instead, a post-treatment plasma increases the density of deposited material (e.g., a sublayer) by bombarding the surface of the material with excited species in a process called "peening". Preferably, some atoms, "implant atoms", are incorporated into the deposited material (e.g., a sublayer of material) during plasma post-treatment.

An exemplary post-treatment gas containing peening species comprises hydrogen atoms. In some embodiments, the post-treatment gas containing peening species includes A2 atoms but no A1 atoms. In other embodiments, the post-treatment gas containing peening species includes A1 atoms but no A2 atoms. In still other embodiments, the post-treatment gas containing peening species includes neither A1 atoms nor A2 atoms.

A basic embodiment of a method of incorporating implant atoms in a thin film on a semiconductor substrate comprises processes of: (a) providing in a vacuum chamber a deposition reactant mixture; (b) applying high-frequency (HF) and low-frequency (LF) power to the deposition reactant mixture to generate a deposition plasma; (c) depositing a sublayer of integrated circuit material on the substrate using the deposition plasma; (d) providing a post-treatment gas containing implant atoms to a vacuum chamber, the post-treatment gas being substantially free of at least one necessary film-forming element; (e) applying HF and LF power to the post-treatment gas to generate a post-treatment plasma, the post-treatment plasma comprising excited implant atoms, and the post-treatment plasma being substantially non-film-forming; (f) post-treating the sublayer in the post-treatment plasma; and (g) repeating the processes (c) and (f) of depositing a sublayer and post-treating the sublayer until a desired thickness of a thin film is achieved. In some embodiments for incorporating implant atoms, the deposition reactant mixture comprises A1 atoms of a chemical element A1 and A2 atoms of a chemical element A2, wherein the element A2 is more electronegative than the element A1, and wherein the A1 atoms have a positive oxidation state and the A2 atoms have a negative oxidation state when A1 atoms are bonded with A2 atoms. In such embodiments, the post-treatment gas containing implant species is substantially free of at least one type of atoms selected from the group consisting of A1-type atoms and A2-type atoms. An exemplary implant atom is hydrogen.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DESCRIPTION OF THE INVENTION

Figure 1:
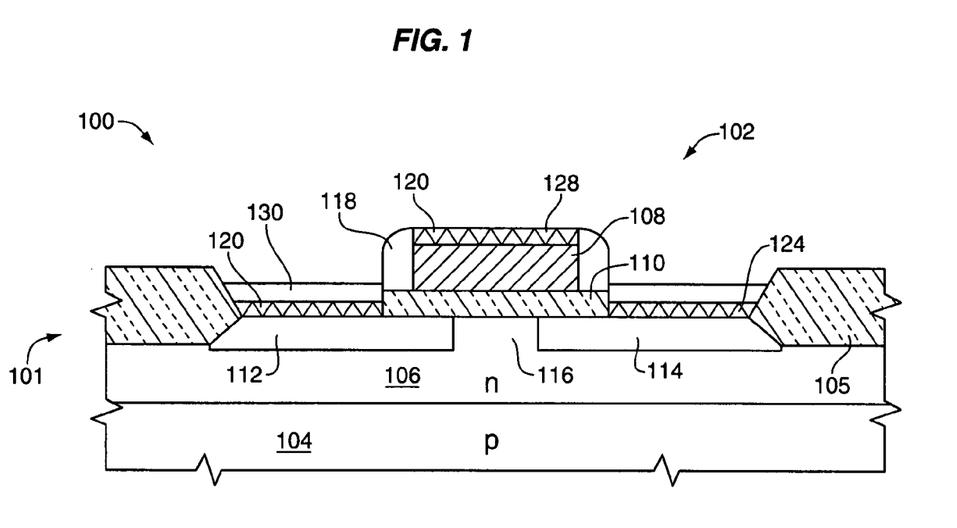
FIG. 1 depicts schematically a cross-sectional view of an integrated circuit substrate containing an exemplary PMOS transistor in accordance with the invention.

The invention is described herein with reference to FIGS. 1-9. It should be understood that FIG. 1, depicting a PMOS device, is not meant to be an actual plan or cross-sectional view of any particular portion of an actual integrated circuit device. In actual devices, the layers will not be as regular and the thicknesses may have different proportions. The various layers in actual devices often are curved and possess overlapping edges. FIG. 1 shows idealized representations which are employed to explain more clearly and fully the method and structures of the invention than would otherwise be possible. Also, FIG. 1 represents only one of innumerable variations of devices that could be fabricated using the method of the invention. Furthermore, processes are described in the specification with reference to FIGS. 1-9 and Examples 1 and 2; nevertheless, it is clear that methods in accordance with the invention can be practiced using structures, apparati and fabrication processes very different from those of FIGS. 1-3 and Examples 1 and 2. The preferred embodiments described herein are exemplary and are not intended to limit the scope of the invention, which is defined in the claims below.

The present invention relates to layers of dielectric material having compressive stress that are useful in integrated circuits. Embodiments in accordance with the invention provide a layer of highly-compressive dielectric material. The specification also teaches an improved strained transistor architecture and fabrication technique. The architecture is explained here with reference to 90 nm logic technology on 300 mm wafers, although it is not so limited in application. Transistor strain is generated in PMOS devices using a highly compressive post-salicide dielectric capping layer on the source and drain regions. The stress from this capping layer is uniaxially transferred to the PMOS channel through the source-drain regions to create compressive strain in the PMOS channel. Examples in accordance with the invention are described mainly with reference to compressive dielectric layers comprising silicon nitride. Silicon nitride material often is represented by the chemical formula $Si_3N_4$. In this specification, silicon nitride is represented by the general chemical formula SiN, which includes $Si_3N_4$ as well as other silicon nitride species. Compressive dielectric material besides SiN, such as compressive layers of silicon carbide, nitrogen-doped silicon carbide, boron nitride, silicon boron nitride, boron carbide, silicon boron carbide, carbon nitride, silicon oxide, and oxygen-doped silicon carbide are useful in integrated circuits. Therefore, other embodiments in accordance with the invention provide a layer of compressive dielectric material comprising silicon carbide, nitrogen-doped silicon carbide, boron nitride, silicon boron nitride, boron carbide, silicon boron carbide, carbon nitride, silicon oxide, oxygen-doped silicon carbide and combinations thereof in addition to or instead of silicon nitride.

It is believed that compressive stress arises when a growing film is bombarded by atoms or ions with high energy by a process of "atomic peening". The energetic species cause atoms to be incorporated into spaces in the growing film that are smaller than the usual atomic volume, and this leads to an expansion of the film outwards from the substrate. In the plane of the film, however, the film is not free to expand and the entrapped atoms cause macroscopic compressive stress. The conditions of energetic bombardment which lead to the production of compressive stress also favor the formation of dense thin films.

It is believed that compressive stress in a film is the result of two competing mechanisms: stress caused by "peening-atoms" which are implanted on or into a subsurface layer of the film by knock-on processes, and reduction of stress due to thermal spikes. Knock-on implantation occurs when an energetic ion transfers sufficient energy to film atoms to implant them below the surface of the film. It should be noted that in order to initiate this process, the incoming ion must have more than some critical threshold energy, the magnitude of which depends on the film structure and composition. The compressive stress caused by implanted atoms is associated with an increase in strain energy of the film. Therefore, a reduction in the stress by movement of the atoms to vacant sites (vacancy not in the conventional sense in a crystalline film, but as in a free-volume-excess in amorphous structures) is energetically favored. The implanted atoms, however, are prevented from moving by the repulsive forces exerted by the surrounding atoms. It is likely that the atoms which acquire more than some excitation energy $E_o$ will escape from their metastable position to the vacant sites in the film. A significant fraction of the energy of a bombarding ion is transferred to violent motion of the atoms in the area of impact. This intense local heating, or "thermal spike", can provide the energy required to release implanted atoms from their metastable positions within the film, causing stress relaxation. In general, it has been observed that stress rises to a maximum with increasing energy and then decreases. This behavior arises as a result of the competition between implantation and stress relaxation.

It was known by the inventors that fabrication of PECVD silicon nitride films fabricated using low-frequency radio-frequency energy (LFRF) in addition to high-frequency radio-frequency energy (HFRF) during plasma processing resulted in compressive films. With low-frequency (400 KHz) power and an increased amount of carrier gas, ions in the plasma gained more energy for a given amplitude of RF voltage. The resulting ion bombardment increased compressive stress in a deposited SiN film.

Also, at lower pressures, the mean free path becomes longer and ions gain more energy before a collision. This suggested to the inventors that lower pressures, higher LF power, and increased dilution with the carrier gas result in dielectric material with higher compressive stress. Using this information, work was done to produce SiN films with a maximum compressive stress of approximately $-11 \times 10^9$ dynes/cm$^2$ with good uniformity. It was not possible, however, to increase the stress further by further adjusting the process parameters.

During plasma deposition, both radical and ionic mechanisms occur concurrently, and one may dominate the other depending on the process parameters. The correlation between the fluxes of radicals and ions are as follows:

$$J_n \propto 1/T \quad (1)$$

$$J_i \propto n_i(T)^{1/2} \quad (2)$$

$$J = J_n + J_i \quad (3)$$

where $J_n$ and $J_i$ denote the flux of neutral radicals and the flux of ions respectively, T is the reaction temperature and $n_i$ is the concentration of ions. T. Lin et al., Japanese Journal of Applied Physics, vol. 39, 6663 (2000).

It is believed that at lower substrate temperatures, the radical mechanism is dominant, resulting in a higher deposition rate, since the mechanism is less selective in bonding with the substrate surface. Since the substrate temperature is too low for active species to react, to rearrange their bonding and to diffuse to stable bonding sites, a film with lower density is deposited. When the substrate temperature is raised, the ionic mechanism becomes predominant. Due to the preference of the charged species attaching to the surface, the bombardment of the surface by ions accelerates the rearrangement of adsorbed atoms on the surface, resulting in a denser film. Thus, the higher the substrate temperature, the denser the film, and the higher the compressive stress. But thermal budget constraints generally prevent deposition of a dielectric layer on transistor structures at a temperature greater than about 425° C. If thermal budget constraints are observed, the salicide is not thermally degraded by the application of the capping layer. As a result, the resistivity of the salicide in the final transistor remains substantially the same as when the salicide was deposited. When there are no thermal budget constraints from underlying layer and device considerations, deposition of compressive SiN or other dielectric material in accordance with the invention may be conducted at temperatures higher than 425° C.

Residual compressive stress is assumed to be related to the incorporation of "peening atoms", such as hydrogen, in the dielectric material and also to the extent of ion bombardment. With higher concentration of incorporated (or implanted) hydrogen, the film becomes more compact, leading to a higher compressive stress. Since ion bombardment was relatively optimized (by optimizing the LF power), attempts were made to make a SiN film more compact by incorporating more hydrogen.

Studies conducted by the inventors indicated that it was possible to increase the hydrogen content and thereby increase compressive stress using a post-deposition plasma treatment. Silicon nitride films were deposited by a PECVD method using a reactant mixture containing silane, ammonia and nitrogen gas in a 4-station tool, in which one fourth of the total film thickness was deposited at each station. A post-deposition plasma treatment of about 20 seconds was conducted after deposition on each station to increase the hydrogen content of the film and thereby the compressive stress. The post-treatment had the same process conditions as the film deposition, except that the flow of SiH$_4$ was shut off. As a result, the plasma post-treatment comprised essentially a N$_2$+NH$_3$ plasma with both HF and LF powers on. It was observed that the stress increased, from approximately $-11 \times 10^9$ dynes/cm$^2$ to about $-12.7 \times 10^9$ dynes/cm$^2$. Correspondingly, the hydrogen content was also observed to increase slightly.

It is believed that a post-treatment plasma affects only the top portion of a deposited dielectric film, with the rest of the film remaining unaffected. In order to affect the entire film, exposure of the underlying parts of the film to the post-treatment is desirable.

Accordingly, a dielectric layer, such as a silicon nitride (SiN) film, in accordance with the invention is formed by depositing multiple sublayers using PECVD and by conducting a plasma post-treatment of each sublayer after it is deposited before depositing the next sublayer. A PMOS transistor in accordance with the invention is formed using a post-salicide processing technique for increasing compressive stress in a dielectric capping layer without thermally degrading the salicide.

FIG. 1 depicts schematically a cross-sectional view 100 of an integrated circuit substrate 101 containing an exemplary PMOS transistor 102 formed in accordance with the invention. Wafer substrate 101 comprises p-doped semiconductor base layer 104, field oxide regions 105, and an n-doped well 106 within base layer 104. PMOS transistor 102 includes a conductive gate electrode 108 separated from n-well 106 by a gate dielectric 110. Typically, dielectric layer 110 comprises a natural oxide, such as silicon dioxide, SiO$_2$. PMOS transistor 102 further comprises p-doped source 112 and drain 114 regions in well 106 on either side of gate 108, and a channel 116 region underlying gate dielectric 110 between source/drain regions 112, 114. In some embodiments, source/drain regions 112, 114 comprise epitaxially-grown compressively strained silicon-germanium (SiGe). Typically, PMOS transistor 104 further comprises sidewall spacers 118 located on gate 108. PMOS transistor 104 further comprises self-aligned silicide (salicide) layer 120 covering source/drain regions 112, 114 and gate 108. Salicide portions 124 cover source/drain 112, 114. Salicide portion 128 covers gate electrode 108. The general manufacturing steps for fabricating PMOS transistors and salicide layers are well-known in the art. Typically, a layer of cobalt metal is blanket deposited on substrate 101 and thermally treated to form self-aligning cobalt silicide portions 124, 128. Alternatively, a layer of nickel metal is blanket deposited on substrate 101 and thermally treated to form self-aligning silicide portions 124, 128. Other refractory metals besides cobalt and nickel, such as tungsten, titanium, and palladium, and various processes are suitable for forming salicide layer 120.

In accordance with the invention, compressive dielectric capping layer 130 covers salicide layer portion 124 above source/drain 112, 114. Dielectric capping layer 130 typically has a thickness in a range of about from 5 to 150 nm. In accordance with the invention, the compressive stress from dielectric capping layer 130 is uniaxially transferred to PMOS channel 116 through source-drain regions 112, 114 to create compressive strain in PMOS channel 116.

Dielectric capping layer 130 is formed on the salicide 120 by a technique that does not require a temperature of greater than 425° C. such that salicide 120 is not thermally degraded by the application of capping layer 130. As a result, the resistivity of salicide 120 in the final transistor 102 remains substantially the same as when it was formed.

The word "substrate" herein can mean an entire workpiece, an underlying insulative material on which wiring is formed, as well as any object on which some material is deposited. In this disclosure, the terms "substrate", "substrate surface" and related terms generally mean the surface of the workpiece as it exists at a particular phase of fabrication and on which a particular fabrication process is being conducted.

The long dimensions of workpieces 101 and of layers 104, 106 in FIG. 1 define planes that are considered to be a "horizontal" plane herein, and directions perpendicular to these planes are considered to be "vertical". Terms of orientation herein, such as "above", "top", "upper", "below", "bottom" and "lower", mean relative to layers 104, 106. That is, if a second element is "above" a first element, it means it is farther from layer 104 or 106; and if it is "below" another element, then it is closer to the layer 104 or 106 than the other element. Similarly, dimensional terms, such as "high" and "higher", have very usual meanings with reference to the horizontal plane defined by the long dimensions of layers 104, 106 in FIG. 1. Terms such as "above" and "below" do not, by themselves, signify direct contact. However, terms such as "directly on" or "directly onto" do signify direct contact of at least a portion of one layer with at least a portion of an underlying or adjacent layer.

Figure 2:
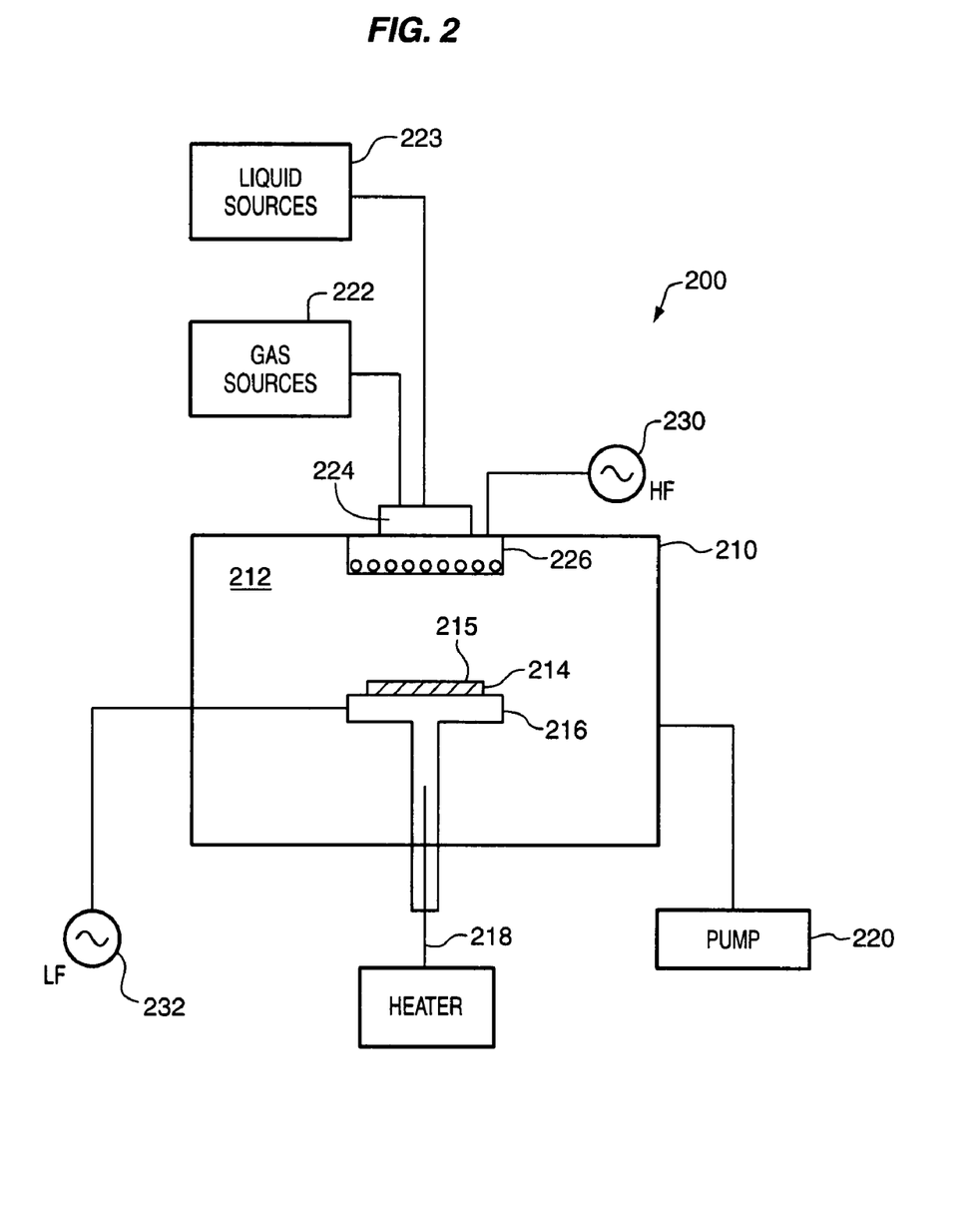
FIG. 2 depicts schematically a CVD apparatus suitable for depositing a highly compressive SiN layer by a plasma-enhanced CVD ("PECVD") method in accordance with the invention.

FIG. 2 depicts schematically a CVD apparatus 200 suitable for depositing a highly compressive dielectric layer by a plasma-enhanced CVD ("PECVD") method in accordance with the invention. Apparatus 200 includes a reaction chamber 210 having a chamber interior 212 capable of holding one or more substrates 214 having an upper surface 215 on which a highly compressive dielectric capping layer in accordance with the invention is to be deposited. Substrate 214 is supported in chamber 210 on substrate holder 216. Substrate holder 216 is functionally coupled with a heating unit 218 for heating substrate 214 to a desired temperature. Generally, substrate 214 is maintained at a temperature in a range of about from 200° C. to 500° C., preferably in a range of about from 375° C. to 425° C. to avoid thermal degradation of circuit components, such as a salicide layer. As is typical in such chambers, the reactor chamber interior 212 is evacuated or pressurized as desired by a suitable pump apparatus schematically represented in FIG. 2 as pump 220. In a method in accordance with the invention, pressures in the reaction chamber generally are maintained in a range of about from 0.1 Torr to 30 Torr, preferably in a range of about from 1 Torr to 3 Torr.

One or more reactants for making dielectric material in accordance with the invention are supplied to reaction chamber 210 from gas sources 222 and liquid sources 223, as appropriate. Inert diluent gases and doping agents, if used, are also supplied from gas sources 222 and liquid sources 223, as appropriate. Gases and liquids from gas sources 222 and liquid sources 223, respectively, are introduced into mixing bowl 224. The interior of mixing bowl 224 is connected to interior 212 of reaction chamber 210 through showerhead 226. Liquids are injected as a fine mist by techniques known in the art into mixing bowl 224. The interior of mixing bowl 224 is maintained at a temperature typically in a range of about from room temperature to 200° C. Fine liquid mist particles evaporate quickly in mixing bowl 224. The gas resulting from gasification of liquid mixes with the other gases in mixing bowl 224. A gaseous mixture containing gaseous precursor reactants flows from mixing bowl 224 through showerhead 226 into the interior 212 of reaction chamber 210. The flow rates of fluids from sources 222, 223 are typically controlled by volumetric flow rate controllers using techniques known in the art. Generally, the gaseous mixture flowing into reaction chamber 210 contains inert carrier or diluent gas that functions in maintaining desired pressure in reaction chamber 210 and in maintaining relatively dilute concentrations of ions in the plasma that is generated.

Plasma discharge is sustained by energy applied to dual-frequency reaction chamber 210 through both a high-frequency ("HF") generator 230, which supplies HF radio-frequency ("RF") power, and a low-frequency ("LF") generator 232, which supplies low-frequency radio-frequency ("LF RF") power to the plasma. Usually, HF RF power is applied to reaction chamber 210 at showerhead 226. Typically, the HF RF plasma energy used is 13.56 MHz, although the invention is not limited to any exact frequency value. Generally, the HF RF has a frequency in a range of about from 1 MHz to 100 MHz, preferably 2 MHz to 30 MHz. HF RF power is generally applied at showerhead 226 at a level of about 0.02 Watts per $cm^2$ to 0.44 Watts per $cm^2$ of substrate surface. LF generator 232 supplies low-frequency power to plasma between showerhead 226 and substrate 214. The low-frequency RF power is generally applied at substrate holder 216. Generally, the LF RF has a frequency in a range of about from 100 kHz to 1 MHz, preferably about 250 kHz. LF RF power is generally applied at a level of about 0.03 Watts per $cm^2$ to 0.64 Watts per $cm^2$ of substrate surface. With respect to applying HF and LF power, the term "to the reaction chamber" is used here in a broad sense. For example, HF power generator 230 supplies power to the gas mixture flowing from mixing bowl 224 through showerhead 226 into vacuum chamber interior 212, as depicted in FIG. 2, or alternatively it supplies power in reaction chamber interior 212. Similarly, LF RF generator 232 applies power to the reaction chamber at an appropriate location; for example, to a substrate holder. With respect to introducing or flowing gases and gaseous molecules "to the vacuum chamber", the term "to the vacuum chamber" and related terms are used broadly to mean towards and up to the vacuum chamber or into the vacuum chamber depending on where plasma-forming power is applied in a particular plasma-treating apparatus used in accordance with the invention. For example, in certain embodiments in accordance with the invention, plasma-initiating power is applied remotely to a gaseous stream prior to its entry into the vacuum chamber, so that molecules originally present in the gaseous stream are already broken up into excited species upon actual entry into the vacuum chamber.

The reactive species present in the plasma react to form compressive dielectric material on the substrate surface.

In a basic embodiment in accordance with the invention, a highly compressive dielectric capping layer is produced by sequentially depositing and plasma post-treating a plurality of dielectric sublayers. In some embodiments, dielectric material is deposited and plasma post-treated on the same wafer substrate more than once in a vacuum chamber of a PECVD apparatus to make a plurality of highly compressive dielectric sublayers before the wafer substrate is removed from the vacuum chamber. In other embodiments, a dielectric sublayer is deposited and plasma post-treated on a wafer in one vacuum chamber, and then the wafer is moved to another vacuum chamber for deposition and plasma post-treating of the next dielectric sublayer. In still other embodiments, a dielectric sublayer is deposited on a wafer in one vacuum chamber, and then the wafer is moved to another vacuum chamber for plasma post-treating.

In certain embodiments in accordance with the invention, nonreactive (inert) diluent gas is used to dilute plasma species and to pressurize the reaction chamber. Suitable nonreactive or inert gases include noble gases, such as helium (He), argon (Ar), neon (Ne), krypton (Kr), and xenon (Xe). In certain embodiments, introduction of inert gases into the reaction chamber serves to adjust film uniformity of the dielectric material, to stabilize the plasma, to improve film stability, and to adjust film stress.

Through selection of operating variables such as composition and flow rates of reactant precursors, inert gas and doping gases, power level, deposition pressure, and temperature, the composition and properties of a dielectric capping layer or other dielectric layer can be controlled. Dynamically varying one or more variables during the course of forming a compressive dielectric film provides further control of the composition and properties of the deposited dielectric material. For example, the hydrogen content of a SiN layer in accordance with the invention typically is around 30 atom percent. Compressive dielectric layers in accordance with the invention are thermally stable in process conditions typically used in semiconductor manufacturing. Therefore, thin-film properties, such as dielectric constant, k, and film stress do not vary significantly during and after subsequent semiconductor manufacturing operations.

The terms "then", "after", "thereafter" and similar terms are used interchangeably in this specification to indicate that a particular process or set of processes is conducted sometime after a previous process. These terms do not necessarily signify immediately thereafter.

The term "A1 atoms", A1-type atoms and related terms in this specification designate atoms of one or more chemical elements that are constituents of a particular dielectric material. The term "A2 atoms", "A2-type atoms" and related terms used with reference to the same dielectric material refer to atoms of one or more chemical elements that are not A1 elements and that are constituents of the particular dielectric material. In some instances, an element that serves as an A2 atom in one particular dielectric material serves as an A1 atom in a different dielectric material. Examples of A1 atoms include silicon (Si), boron (B), and carbon (C). Examples of A2 atoms include nitrogen (N), carbon (C), and oxygen (O). In a given dielectric material, an A2 element is more electronegative than a corresponding A1 element, and an A1 atom has a positive oxidation state, while an A2 atom has a negative oxidation state. For example, in a dielectric layer comprising silicon nitride, silicon (Si) is the A1 element, nitrogen (N) is the A2 element, nitrogen is more electronegative than silicon, silicon (A1) has an oxidation state of +4, and nitrogen (A2) has an oxidation state of −3. Similarly, in silicon carbide, Si is the A1 element, and carbon (C) is the A2 element, carbon is more electronegative than silicon, silicon (A1) has an oxidation state of +4, and carbon (A2) has an oxidation state of −4. In carbon nitride, C is the A1 element, and N is the A2 element, nitrogen is more electronegative than carbon, carbon (A1) has an oxidation state of +4, and nitrogen (A2) has an oxidation state of −4. In silicon oxide ($SiO_2$), Si is the A1 element, and oxygen (O) is the A2 element, oxygen is more electronegative than silicon, silicon (A1) has an oxidation state of +4, and oxygen (A2) has an oxidation state of −2. In boron nitride, boron (B) is the A1 element, nitrogen (N) is the A2 element, nitrogen is more electronegative than boron, boron (A1) has an oxidation state of +3, and nitrogen (A2) has an oxidation state of −3. Some dielectric materials in accordance with the invention contain A1 atoms of a plurality of A1-type elements and/or contain A2 atoms of a plurality of A2-type elements. In silicon boron nitride ($Si_3B_3N_7$), silicon and boron are A1 elements, nitrogen is the A2 element, nitrogen is more electronegative than silicon and boron, silicon (A1) has an oxidation state of +4, boron (A1) has an oxidation state of +3, and nitrogen (A2) has an oxidation state of −3.

An A1-containing species is a chemical compound or species containing one or more A1-type atoms. Examples of a silicon-containing species include tetramethylsilane, tetraethylsilane, and silane. Similarly, an A2-containing species contains one or more A2-type atoms. For example, ammonia is an A2-containing species that provides N-atoms for making silicon nitride.

The terms "peening atom", "peening species" and related terms in this specification designate an atom or species that becomes energized by plasma discharge of a post-treatment plasma and either bombards deposited dielectric material or provides energy to other species, thereby increasing ion bombardment of the dielectric material, or both. This bombardment increases the compressive stress of the dielectric material. The term "peening species" refers generally to any type of peening species, including atoms, ions, compounds and radicals. The term "peening species" is also used broadly to designate a chemical compound in post-treatment gas that produces a peening atom or peening species as a result of plasma discharge. In some embodiments, a peening species is incorporated or implanted in dielectric material and thereby increases the compressive stress of the dielectric material. Thus, the term "implant atom" refers to an atom that is implanted in deposited material during plasma post-treatment. Generally, an implant atom functions as a peening species, but not all peening species are implant atoms. Typically, hydrogen atoms serve as peening atoms and implant atoms in embodiments in accordance with the invention. Generally, hydrogen does not serve as an A2 atom. In some embodiments, an inert gas acts as a peening species, although it is believed that an inert-gas atom generally is not incorporated in a thin film formed in accordance with the invention.

The terms "A1 atoms", "A2 atoms", "peening species", "implant atoms" and related terms have similar meanings when used with reference to forming relatively conductive layers and other relatively non-dielectric layers using methods in accordance with the invention.

In some embodiments, an A2 atom that is used to form dielectric material during deposition processes also functions as a peening atom, which is incorporated (or implanted) in the dielectric material during plasma post-treatment. In other embodiments, an A1 atom that is used to form dielectric material during deposition processes also functions as a peening atom, which is incorporated (or implanted) in the dielectric material during plasma post-treatment.

In some embodiments, a single type of chemical compound provides A2 atoms and peening atoms. For example, ammonia provides both nitrogen A2 atoms and hydrogen peening atoms. Depending on the dielectric material being formed, methane is an example of a compound that provides both peening atoms (hydrogen) and A1 atoms (in carbon nitride) or A2 atoms (in silicon carbide).

Figure 3:
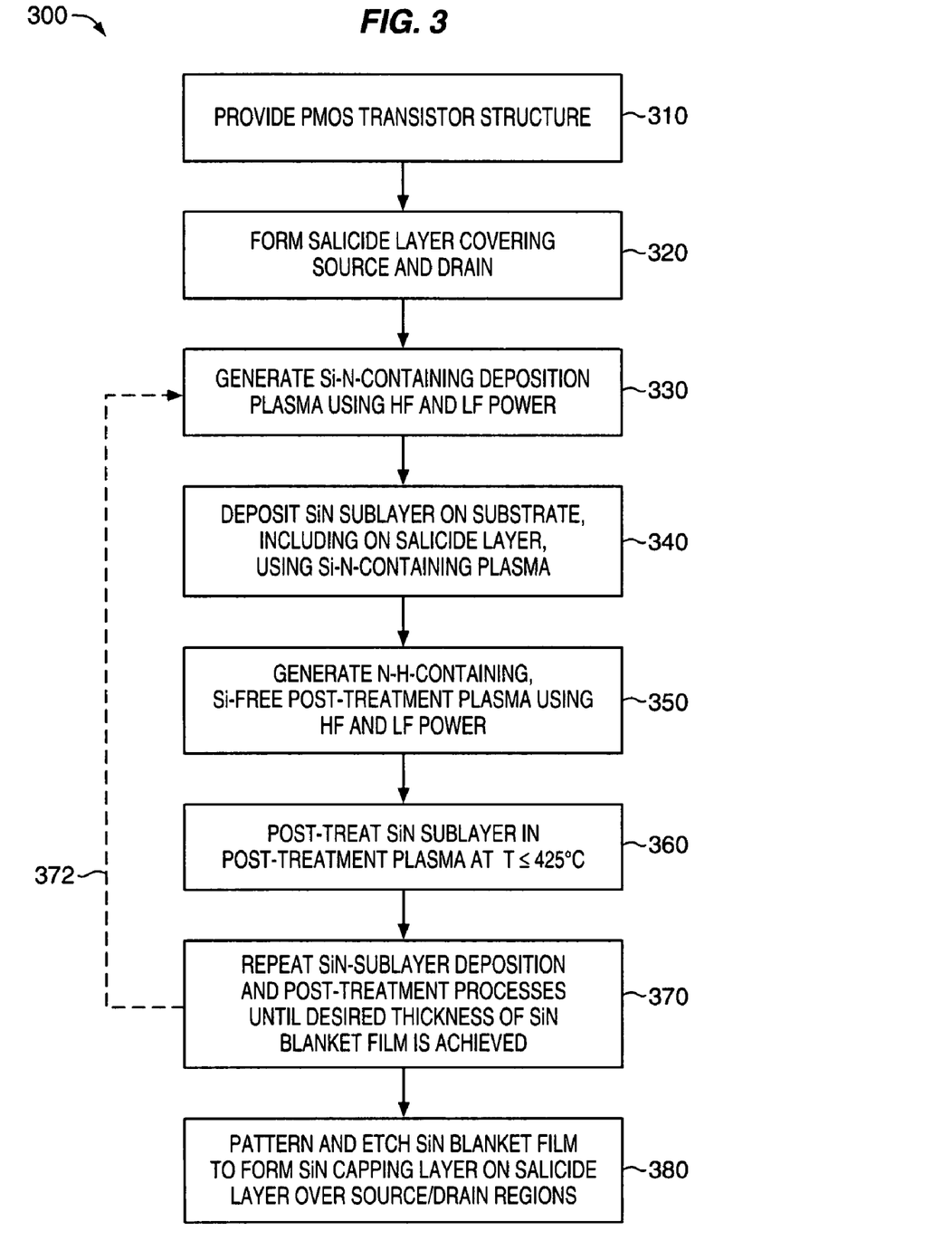
FIG. 3 contains a generalized process flow chart of a method in accordance with the invention for fabricating a PMOS transistor having a SiN capping layer with compressive stress.

FIG. 3 contains a generalized process flow chart 300 of a method in accordance with the invention for fabricating a PMOS transistor having a compressive SiN capping layer. Process flowchart 300 is described with reference to FIGS.

1 and 2. It is understood, however, that a compressive dielectric capping layer in accordance with the invention is useful for generating compressive strain in many types and designs of PMOS transistors. It is further understood that methods in accordance with the invention are useful for providing compressive dielectric material in other integrated circuit structures.

Processes 310 include providing a PMOS transistor structure on a semiconductor wafer substrate 101, as depicted in FIG. 1. Typically, a PMOS transistor structure includes an n-doped well 106, a gate dielectric 1.10, a conductive gate electrode 108, p-doped source and drain regions 112, 114 on either side of gate 110, and a channel 116 underlying gate 110. In some embodiments, the source and drain regions include compressive SiGe. In processes 320, a salicide layer 120 is formed on source/drain regions 112, 114 and on gate 108. The general manufacturing steps for fabricating PMOS transistors and salicide layers are well-known in the art.

Processes 330 include flowing a gaseous, deposition reactant mixture containing silicon (A1) atoms and nitrogen (A2) atoms into a vacuum chamber, such as chamber 210 of FIG. 2, and applying both HF and LF power to the chamber to generate a deposition plasma. In some embodiments, a reactant mixture also comprises peening atoms and/or an inert gas. An exemplary reactant mixture includes $SiH_4$, $NH_3$, $N_2$ and helium (He). In some embodiments, the flow rate of inert gas into the vacuum chamber is not less than about 20 percent of the total flow rate of the reactant mixture. Generally, pressure in the vacuum chamber is maintained in a range of about from 0.1 Torr to 30 Torr, preferably in a range of about from 1 Torr to 3 Torr. Preferably, the LF power is more than the HF power. Typically, the HFRF frequency used is 13.56 MHz at a power level of about 0.02 Watts per $cm^2$ to 0.44 Watts per $cm^2$ of substrate surface. Generally, the LFRF has a frequency in a range of about from 100 kHz to 1 MHz, preferably about 250 kHz. LF RF power is generally applied at a level of about 0.03 Watts per $cm^2$ to 0.64 Watts per $cm^2$ of substrate surface.

In processes 340, a SiN sub-layer is deposited on substrate 101, including directly on salicide layer 120, by exposing substrate 101 to the Si—N-containing deposition plasma in a vacuum chamber. Typically, the substrate is exposed to the deposition plasma for a time duration in a range of about from 0.5 second to 25 seconds to make a SiN sub-layer having a thickness in a range of about from 0.5 nm to 25 nm. To stay within thermal budget constraints, the substrate typically is heated during SiN sub-layer deposition processes to a temperature not exceeding 425° C. Generally, the substrate is heated at the same temperature during both deposition processes 340 and post-treatment processes. Typically, a heater 218 in a substrate holder 216 heats the wafer and maintains its temperature.

A set of representative ranges of operating variables and conditions for generating an exemplary Si—N-containing plasma in processes 330 and depositing a compressive SiN sub layer in processes 340 in accordance with the invention is presented here. The flow rates and operating parameters listed are valid for a Novellus "Vector" PECVD module having four RF stations to deposit SiN on 300 mm semiconductor wafers. The free volume of the vacuum chamber at each of the four RF stations is about 195 liters. It is understood that the flow rates (standard vapor and pressure) listed here would require modification for a different-sized reaction chamber or wafer.

| | |
|---|---|
| $SiH_4$: | 50-1000 sccm |
| $NH_3$: | 250 sccm-10000 sccm |
| $N_2$: | 3 liters/min-60 liters/min |
| Inert gas: | 1 liters/min-30 liters/min (e.g., He) |
| HF-RF: | 150 W-1500 W |
| LF RF: | 150 W-2500 W |
| Pressure: | 1 Torr-3 Torr |
| Temperature: | 200° C.-500° C. |

Processes 350 include flowing a gaseous nitrogen-hydrogen-containing post-treatment gas into a vacuum chamber, such as chamber 210 of FIG. 2, and applying both HF and LF power to the chamber to generate a nitrogen-hydrogen containing post-treatment plasma. In some embodiments, the post-treatment gas comprises hydrogen (peening species), but no substantial nitrogen. A post-treatment mixture, however, generally comprises a species containing hydrogen (peening) atoms, a species containing nitrogen (A2) atoms, and an inert gas. In some embodiments, a single species provided to the vacuum chamber contains both A2 atoms and peening atoms. An exemplary post-treatment gas mixture includes $NH_3$, $N_2$ and helium (He). In some embodiments, the flow rate of inert gas into the vacuum chamber is not less than about 20 percent of the total flow rate of the post-treatment mixture. Generally, pressure in the vacuum chamber is maintained in a range of about from 0.1 Torr to 30 Torr, preferably in a range of about from 1 Torr to 3 Torr. Preferably, the LF power is more than the HF power. Typically, the HFRF power used is 13.56 MHz at a level of about 0.02 Watts per $cm^2$ to 0.44 Watts per $cm^2$ of substrate surface. Generally, the LFRF has a frequency in a range of about from 100 kHz to 1 MHz, preferably about 250 kHz. LF RF power is generally applied at a level of about 0.03 Watts per $cm^2$ to 0.64 Watts per $cm^2$ of substrate surface. Preferably, a post-treatment gas mixture and the resulting post-treatment plasma comprise substantially no A1 atoms. In some embodiments, a gaseous post-treatment mixture is provided by maintaining the same flow of gases of a deposition reactant mixture (processes 330) except for stopping the flow of the silicon-containing species.

Processes 360 include post-treating the SiN sublayer that was deposited in the preceding processes 340. Processes 360 include exposing the SiN sublayer on substrate 101 to the post-treatment plasma generated in processes 350. Generally, a SiN sublayer is exposed to post-treatment plasma for a post-treatment time in a range of about from 0.5 second to 30 seconds, typically for a sublayer post-treatment time in a range of about from 0.5 second to 15 seconds. In some embodiments, the sublayer post-treatment time is in a range of about from 0.5 second to 5 seconds. To stay within thermal budget constraints, the substrate is heated during the post-treatment processes 360 to a temperature not exceeding 425° C., preferably not exceeding 400° C. Typically, a heater 218 in a substrate holder 216 heats the wafer and maintains its temperature.

A set of representative ranges of operating variables and conditions for generating an exemplary nitrogen-hydrogen containing post-treatment plasma in processes 350 and post-treating a compressive SiN sublayer in processes 360 in accordance with the invention is presented here. The flow rates and operating parameters listed are valid for a Novellus "Vector" PECVD module having four RF stations for conducting a post-deposition plasma anneal of a SiN sublayer on 300 mm semiconductor wafers. It is understood that the flow rates (standard vapor and pressure) listed here would require modification for a different-sized reaction chamber or wafer.

| SiH$_4$: | none |
|---|---|
| NH$_3$: | 250 sccm-10000 sccm |
| N$_2$: | 3 liters/min-60 liters/min |
| Inert gas: | 1 liters/min-30 liters/min (e.g., He) |
| HF-RF: | 150 W-1500 W |
| LF RF: | 150 W-2500 W |
| Pressure: | 1 Torr-3 Torr |
| Temperature: | 200-500° C. |

Processes 370 comprise repeating processes 340 and 360 of depositing a SiN sublayer and post-treating the SiN sublayer, respectively, as indicated by the dashed arrow 372 in FIG. 3, to form a blanket film of SiN having compressive stress on substrate 101, including on salicide layer 120 covering source and drain regions 112, 114. SiN sublayer deposition and post-treatment processes are repeated to form sequentially a plurality of compressive SiN sublayers one on top of the other until a desired thickness of a conformal blanket SiN film is achieved. Generally, processes 340, 360 are repeated until the SiN blanket film has a total thickness in a range of about from 5 nm to 200 nm. Typically, processes 340, 360 are repeated until the SiN blanket film layer has a total thickness in a range of about from 30 nm to 90 nm. In some embodiments, processes 370 repeating the deposition and post treatment of a plurality of SiN sublayers results in the formation of from four to 80 SiN sublayers, typically in a range of about from 12 to 40 SiN sublayers. Processes 370 repeating the deposition and posttreatment of a SiN sublayer generally are conducted so that exposure of the PMOS transistor structure to elevated post-treatment temperatures does not exceed a total post-treatment time of 600 seconds. In some embodiments, the exposure of substrate 101 and the PMOS transistor structure to elevated post-treatment temperatures does not exceed a total post-treatment time of 200 seconds. In other embodiments, the total post-treatment time does not exceed 150 seconds.

In some embodiments in accordance with the invention, processes such as processes 330, 340, 350, 360 are conducted in the same vacuum chamber, and then these processes are repeated (processes 370) in the same vacuum chamber until a compressive SiN layer has formed, such as a compressive SiN capping layer. In other embodiments, processes 330, 340, 350, 360 are conducted in the same vacuum chamber one or more times, and then the substrate is moved to another vacuum chamber for additional depositions of SiN sublayers. In still other embodiments, processes 330 and 340 are conducted in a vacuum chamber, and then the substrate wafer is moved to another vacuum chamber in which processes 350 and 360 are conducted.

In processes 380, patterning and etching of the SiN blanket film is conducted to form SiN capping layer 130 on salicide portion 124 and to remove SiN from other surface areas of the substrate.

Typically, salicide layer portion 124 is formed directly on source/gate regions 112, 114. In some embodiments, one or more layers of other integrated circuit material are located between salicide 124 and source/gate regions 112, 114. Typically, SiN capping layer 130 is formed directly on salicide layer portion 124. In some embodiments, one or more layers of other integrated circuit material are located between SiN capping layer 130 and salicide layer portion 124.

Methods in accordance with the invention similar to process flowchart 300 of FIG. 3 are useful for forming compressive dielectric layers comprising other dielectric material, such as silicon carbide, nitrogen-doped silicon carbide, boron nitride, silicon boron nitride, boron carbide, silicon boron carbide, carbon nitride, silicon oxide, oxygen-doped silicon carbide.

A set of representative ranges of operating variables and conditions for generating an Si—C-containing deposition plasma and depositing a compressive silicon carbide sublayer in accordance with the invention is presented here. The flow rates and operating parameters listed are valid for a Novellus "Vector" PECVD module having four RF stations to deposit SiC on 300 mm semiconductor wafers.

| Tetramethylsilane (4 MS): | 50-1000 sccm |
|---|---|
| CH$_4$: | 250-20000 sccm |
| N$_2$ | 3-60 liters/min |
| NH3 | 250-10000 sccm |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a C—H-containing, Si-free post-treatment plasma are substantially the same as above, except that the flow of tetramethyl silane is zero.

A set of representative ranges of operating variables and conditions for generating an Si—N—C-containing deposition plasma and depositing a compressive nitrogen-doped silicon carbide sublayer in accordance with the invention is presented here. The flow rates and operating parameters listed are valid for a Novellus "Vector" PECVD module having four RF stations to deposit SiNC on 300 mm semiconductor wafers.

| Tetramethylsilane (4 MS) | 50-1000 sccm |
|---|---|
| NH$_3$: | 250 sccm-10000 sccm |
| N$_2$: | 3 liters/min-60 liters/min |
| CH$_4$: | 50-20000 sccm |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a N—C—H-containing, Si-free post-treatment plasma are substantially the same as above, except that the flow of tetramethyl silane is zero.

A set of representative ranges of operating variables and conditions for generating an Si—B—N-containing deposition plasma and depositing a compressive silicon boron nitride sublayer in accordance with the invention is presented here. The flow rates and operating parameters listed are valid for a Novellus "Vector" PECVD module having four RF stations to deposit SiNC on 300 mm semiconductor wafers.

| SiH$_4$: | 50-1000 sccm |
|---|---|
| B$_2$H$_6$ | 50-20000 sccm |
| NH$_3$: | 250 sccm-10000 sccm |

-continued

| | |
|---|---|
| N₂: | 3 liters/min-60 liters/min |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a N—H-containing, Si-free post-treatment plasma are substantially the same as above, except that the flowrates of silane and $B_2H_6$ are zero.

A set of representative ranges of operating variables and conditions for generating an B—N-containing deposition plasma and depositing a compressive boron nitride sublayer in accordance with the invention is presented here. The flow rates and operating parameters listed are valid for a Novellus "Vector" PECVD module having four RF stations to deposit BN on 300 mm semiconductor wafers.

| | |
|---|---|
| $B_2H_6$ | 250-20000 sccm |
| NH₃: | 250 sccm-10000 sccm |
| N₂: | 3 liters/min-60 liters/min |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a N—H containing post-treatment plasma are substantially the same as above, except that the flowrate of $B_2H_6$ is zero.

A set of representative ranges of operating variables and conditions for generating a Si—B—C-containing deposition plasma and depositing a compressive silicon boron carbide sublayer in accordance with the invention is presented here. The flow rates and operating parameters listed are valid for a Novellus "Vector" PECVD module having four RF stations to deposit SiNC on 300 mm semiconductor wafers.

| | |
|---|---|
| Tetramethylsilane (4 MS): | 50-1000 sccm |
| $B_2H_6$: | 50-20000 sccm |
| CH₄: | 50-20000 sccm |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a N—H-containing, Si-free post-treatment plasma are substantially the same as above, except that the flowrates of 4MS and $B_2H_6$ are zero.

A set of representative ranges of operating variables and conditions for generating a B—C-containing deposition plasma and depositing a compressive boron carbide sublayer in accordance with the invention is presented here. The flow rates and operating parameters listed are valid for a Novellus "Vector" PECVD module having four RF stations to deposit SiNC on 300 mm semiconductor wafers.

| | |
|---|---|
| $B_2H_6$: | 50-20000 sccm |
| CH₄: | 50-20000 sccm |
| Inert gas: | 1 liters/min-30 liters/min (e.g., He) |
| HF-RF: | 150 W-1500 W |
| LF RF: | 150 W-2500 W |
| Pressure: | 1 Torr-5 Torr |
| Temperature: | 200° C.-500° C. |

Representative ranges of operating parameters for generating a C—H-containing, Si-free post-treatment plasma are substantially the same as above, except that the flowrate of $B_2H_6$ is zero.

EXAMPLE 1

Silicon nitride (SiN) was deposited on the silicon substrate of a series of commercially-available 300 mm silicon semiconductor wafers. SiN was deposited on each wafer using a PECVD process in all four RF stations of a Novellus "Vector" apparatus. The deposition plasma conditions and the post-treatment plasma conditions were the same for all wafers, and are summarized here for the "Vector" apparatus as a whole. Flow rates and power values for each of the four RF stations correspond to one-fourth of the values listed below.

SiN plasma deposition conditions:

| | |
|---|---|
| SiH₄ flow: | 600 sccm |
| NH₃ flow: | 1000 sccm |
| N₂ flow: | 35 liters/min |
| He gas flow: | 6 liters/min |
| HF-RF: | 300 W (13.6 MHz) |
| LF RF: | 700 W (250 kHz) |
| Pressure: | 2.1 Torr |
| Wafer temperature: | 400° C. |

Post-treatment plasma conditions:

| | |
|---|---|
| SiH₄ flow: | none |
| NH₃ flow: | 1000 sccm |
| N₂ flow: | 35 liters/min |
| He gas flow: | 6 liters/min |
| HF-RF: | 300 W (13.6 MHz) |
| LF RF: | 700 W (250 kHz) |
| Pressure: | 2.1 Torr |
| Wafer temperature: | 400° C. |

The distance between the showerhead gas inlet and the substrate surface was about 1.4 cm. The number of SiN sublayers deposited on a wafer in each RF station varied between wafers from one SiN sublayer to six SiN sublayers. The total thickness of each final deposited SiN layer was about 50 nm (or 500 Å). The various combinations among the different wafers of number of sublayers per station, the total number of layers, and the thickness per sublayer are summarized in Table 1, below.

TABLE 1

| Sublayers per station | Total no. of sublayers | Thickness per sublayer (Å) |
|---|---|---|
| 1 | 4 | 126 |
| 2 | 8 | 64 |

TABLE 1-continued

| Sublayers per station | Total no. of sublayers | Thickness per sublayer (Å) |
|---|---|---|
| 3 | 12 | 40 |
| 4 | 16 | 32 |
| 5 | 20 | 25 |
| 6 | 24 | 21 |

The duration of the plasma post-treatment times also varied between wafers at 4, 9, 14 and 24 seconds post-treatment time per sublayer.

Uniformity considerations prompted the use of a positive preA plasma exposure of each wafer for one or several seconds before each deposition of a SiN sublayer. A preA plasma exposure occurred when plasma was turned ON before the SiH$_4$ gas (manifold "A") was introduced into the chamber. During a preA plasma exposure, a N$_2$+NH$_3$ plasma is present in the vacuum chamber. Thus, a preA plasma exposure functions as a Si-free, nitrogen-hydrogen containing plasma post-treatment of a previously deposited SiN sublayer. A posA plasma exposure of each wafer was also conducted after each deposition of a SiN sublayer. A posA plasma exposure occurred when plasma remained ON after the SiH$_4$ gas (manifold "A") was diverted away from the vacuum chamber. During a posA plasma exposure, a N2+NH3 plasma is present in the vacuum chamber. Thus, a posA plasma exposure functions as a Si-free, nitrogen-hydrogen containing plasma post-treatment in accordance with the invention. A preA plasma exposure of 3 seconds and a posA plasma exposure of 1 second were conducted during SiN deposition processes on some of the wafers, resulting in a plasma post-treatment time of 4 seconds for each SiN sublayer. For other wafers, a preA plasma exposure of 3 seconds and a posA plasma exposure of 6 seconds were conducted during SiN deposition processes, resulting in a plasma post-treatment time of about 9 seconds for each SiN sublayer. Through extension of the posA plasma exposure time, a plasma post-treatment of other wafers was conducted for 14 seconds or 24 seconds.

Using standard conventional techniques, various properties of the final SiN layers were measured, including stress, atomic percent of hydrogen, SiH concentration and NH concentration. The results of the measurements are plotted in the graphs of FIGS. 4-7. Values of compressive stress are expressed here using negative numbers, as is common in the art. The term "greater compressive stress" and similar terms relates to a stress value that is more compressive, and therefore, more negative.

Figure 4:
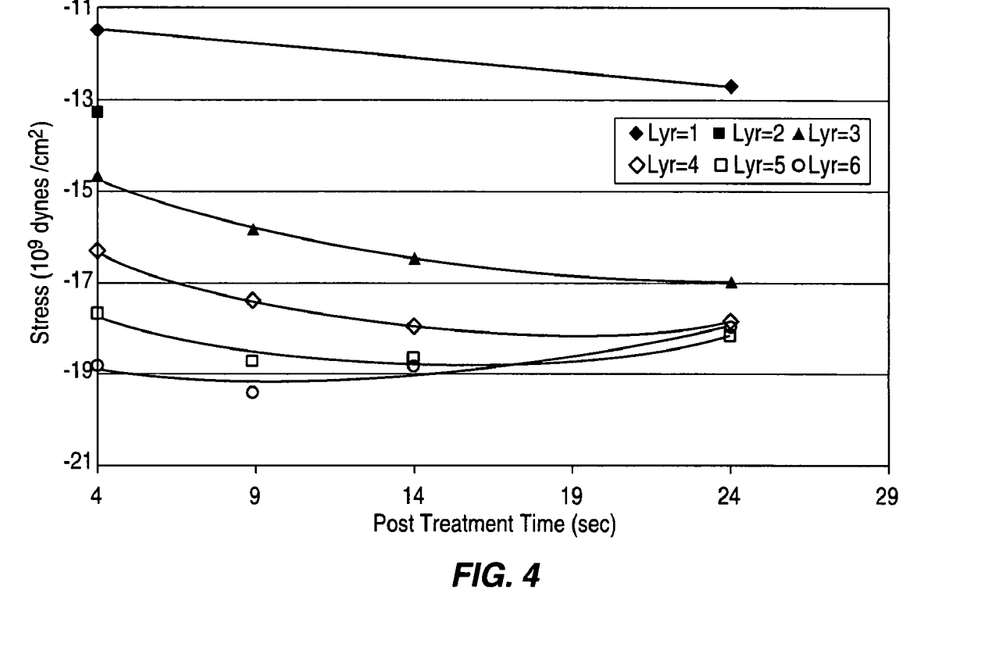
FIG. 4 contains a graph in which stress (in units of $10^9$ dynes/cm$^2$) measured in SiN films was plotted as a function of post-treatment time.

FIG. 4 contains a graph in which measured stress (in units of 10$^9$ dynes/cm$^2$) was plotted as a function of post-treatment time. As indicated in FIG. 4, the compressive stress increases with increasing post-treatment time for all layers, but the stress increase depended more on increasing number of layers than on increasing post-treatment time. With a plasma post-treatment time of four seconds for each SiN sublayer, the compressive stress was seen to increase from −11×10$^9$ dynes/cm$^2$ to −19×10$^9$ dynes/cm$^2$ by increasing the number of depositions from one layer to 6 SiN sublayers at each of four RF stations. It was also observed that the compressive film stress starts to decrease with longer post-treatment times. The post-treatment time at which this inversion occurs decreases with increasing number of sublayers (decreasing sublayer thickness). Examination of these films (in which compressive stress decreased as a result of a longer post-treatment time) showed blistering in the deposited layer. It is believed that increased ion bombardment with longer post-treatment times caused deposited SiN to blister, and thereby lowered the stress. These results suggest that increasing the number of SiN sublayers layers while minimizing the post-treatment time increases compressive stress while minimizing the chances of blistering.

Figure 5:
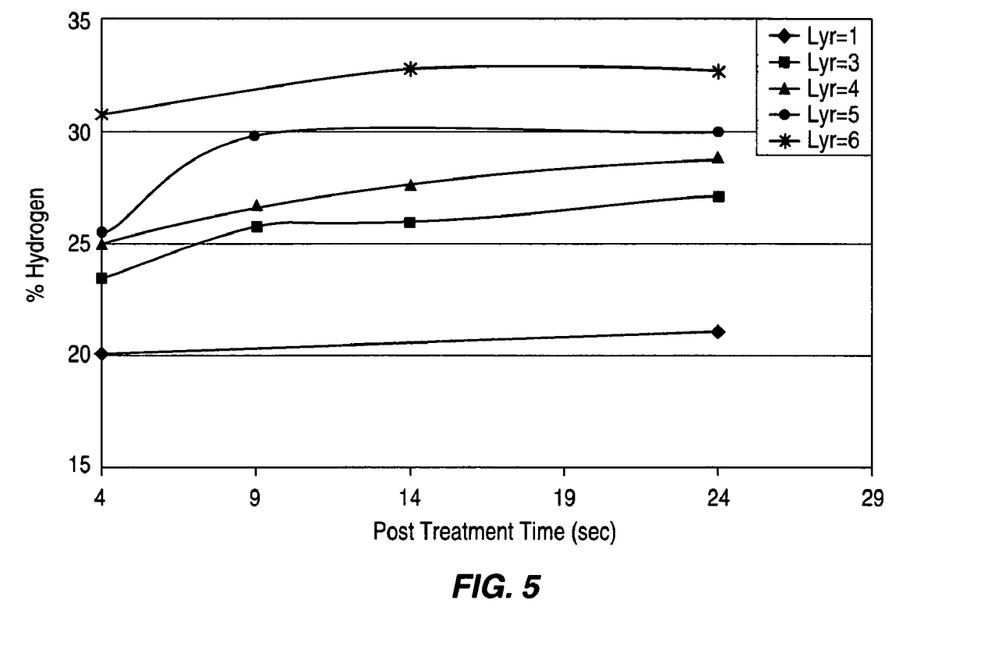
FIG. 5 contains a graph in which the atomic percentage of hydrogen in a final deposited layer of SiN was plotted as a function of post-treatment time.
Figure 6:
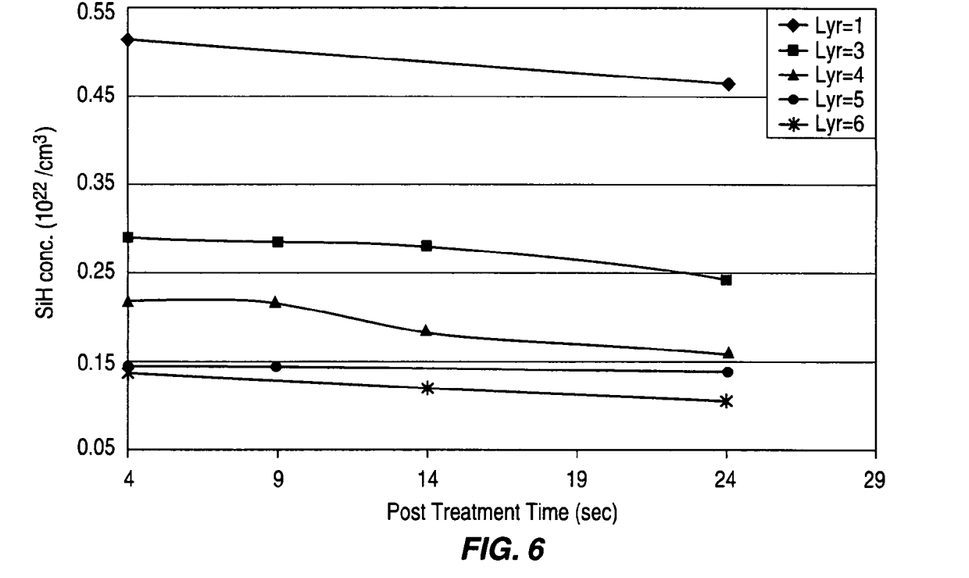
FIG. 6 contains a graph in which the concentration of SiH (in units of $10^{22}$/cm$^3$) in the final deposited layer of SiN films was plotted as a function of post-treatment time.
Figure 7:
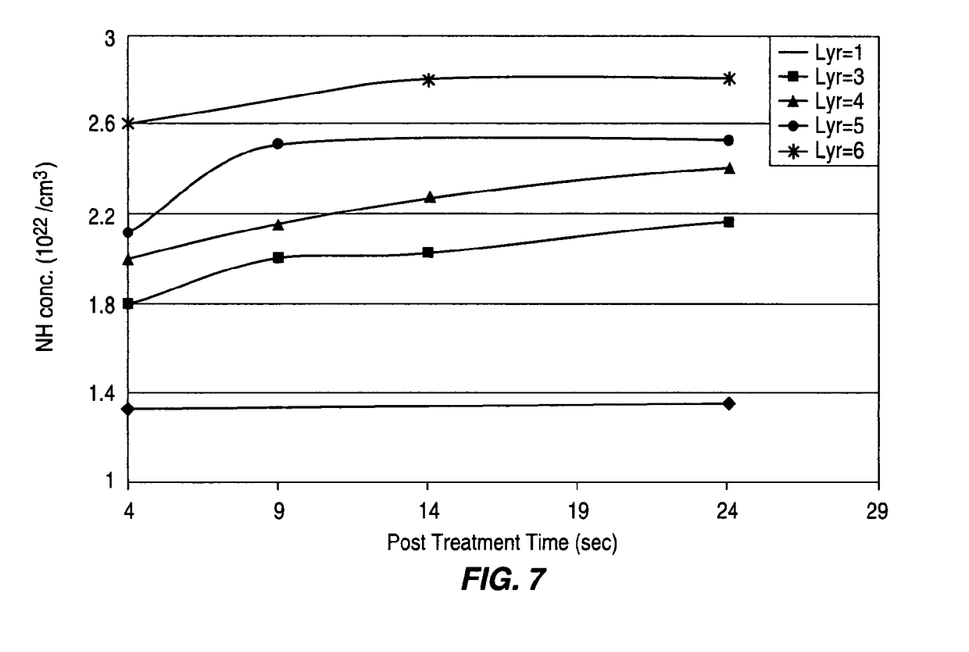
FIG. 7 contains a graph in which the concentration of NH (in units of $10^{22}$/cm$^3$) in the final deposited layer of SiN films was plotted as a function of post-treatment time.

FIG. 5 contains a graph in which the atomic percentage of hydrogen in the final deposited layer of SiN was plotted as a function of post-treatment time. FIG. 5 indicates that the total hydrogen content of the film increased with increasing number of layers and with increased post-treatment time. This suggests that increased hydrogen content results in a more compact film, with higher compressive stress. FIG. 6 contains a graph in which the concentration of SiH (in units of 10$^{22}$/cm$^3$) in the final deposited layer of SiN was plotted as a function of post-treatment time. FIG. 7 contains a graph in which the concentration of NH (in units of 10$^{22}$/cm$^3$) in the final deposited layer of SiN was plotted as a function of post-treatment time. FIGS. 6 and 7 indicate the SiH content of the film decreased, while the NH content increased with increased number of sublayers and generally with increased post-treatment time. It is believed that the energy from the plasma was sufficient to break the SiH bonds on the exposed film due to their lower activation energy. On the other hand, it is believed that post-treatment plasma made with a gas mixture containing N$_2$+NH$_3$ caused more NH bonds to be incorporated into the film, mainly due to the ion bombardment brought about by the LF power. The sum effect was increased hydrogen being incorporated into the film, thereby increasing the compressive stress.

NH incorporation into an SiN film during the post-deposition plasma treatment is expected to occur only in the top few atomic layers of the film due to the limited penetration depth of the plasma. This would result in only a small change in the NH concentration in a thick layer of SiN. It is believed, therefore, that increasing the number of SiN sublayers in a SiN film plays a critical role because each thin sublayer is compacted using plasma-post-treating to produce a sublayer that has a substantially high hydrogen content. As a result, a layer of SiN comprising a plurality of substantially compacted SiN sublayers is well compacted throughout its depth, resulting in increased compressive stress in the final SiN layer.

EXAMPLE 2

Silicon nitride (SiN) was deposited on the silicon substrate of a series of commercially-available 300 mm silicon semiconductor wafers. SiN was deposited on each wafer using a PECVD process in all four RF stations of a Novellus "Vector" apparatus. The deposition plasma conditions and the post-treatment plasma conditions were the same for all wafers, and are summarized here for each "Vector" RF station as a whole. Flow rates and power values for each of the four RF stations correspond to one-fourth of the values listed below.

SiN plasma deposition conditions:

| | |
|---|---|
| SiH$_4$ flow: | 600 sccm |
| NH$_3$ flow: | 1000 sccm |
| N$_2$ flow: | 35 liters/min |
| HF-RF: | 300 W (13.6 MHz) |
| LF RF: | 700 W (250 kHz) |

-continued

| | |
|---|---|
| Pressure: | 2.1 Torr |
| Wafer temperature: | 400° C. |

Post-treatment plasma conditions:

| | |
|---|---|
| SH$_4$ flow: | none |
| NH$_3$ flow: | 1000 sccm |
| N$_2$ flow: | 35 liters/min |
| HF-RF: | 300 W (13.6 MHz) |
| LF RF: | 700 W (250 kHz) |
| Pressure: | 2.1 Torr |
| Wafer temperature: | 400° C. |

The distance between the showerhead gas inlet and the substrate surface was about 1.4 cm. The number of SiN sublayers deposited on a wafer in each RF station varied between wafers from one SiN sublayer to eight SiN sublayers. The total thickness of each final deposited SiN layer was about 50 nm (or 500 Å). The various combinations among the different wafers of number of sublayers per station, the total number of layers, and the thickness per sublayer are summarized in Table 2, below.

TABLE 2

| Sublayers per station | Total no. of sublayers | Thickness per sublayer (Å) |
|---|---|---|
| 1 | 4 | 126 |
| 2 | 8 | 64 |
| 3 | 12 | 40 |
| 4 | 16 | 32 |
| 5 | 20 | 25 |
| 6 | 24 | 21 |
| 7 | 28 | 18 |
| 8 | 32 | 16 |

The duration of the plasma post-treatment times also varied between wafers at 0, 1, and 4 seconds post-treatment time per sublayer.

A preA plasma exposure of 3 seconds and a posA plasma exposure of 1 second were conducted during SiN deposition processes on some of the wafers, resulting in a plasma post-treatment time of 4 seconds for each SiN sublayer. For other wafers, a preA plasma exposure of −2 seconds (i.e., SiH$_4$ gas was turned on 2 seconds before plasma was generated) and a posA plasma exposure of 1 second were conducted during SiN deposition processes, resulting in a plasma post-treatment time of about 1 second for each SiN sublayer. For still other wafers, a preA plasma exposure of −2 seconds and a posA plasma exposure of zero seconds were conducted during SiN deposition processes, resulting in zero plasma post-treatment time.

Figure 8:
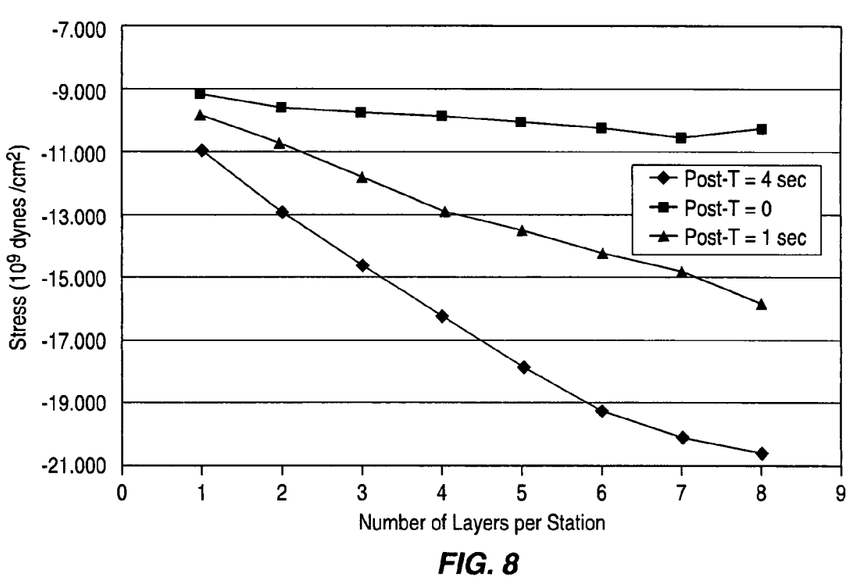
FIG. 8 contains a graph in which stress (in units of $10^9$ dynes/cm$^2$) measured in SiN films was plotted as a function of the number of SiN sublayers deposited in accordance with the invention at each of four RF stations.
Figure 9:
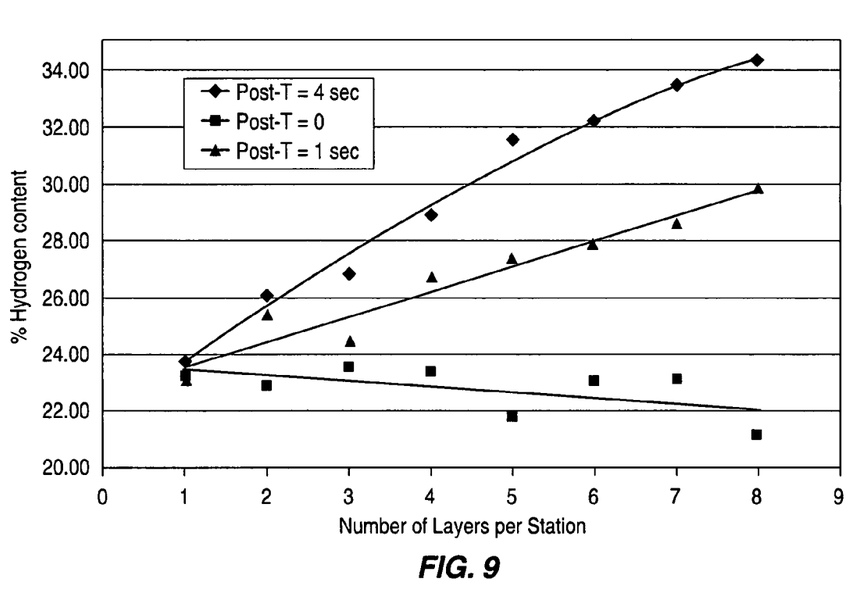
FIG. 9 contains a graph in which the atomic percentage of hydrogen in a final deposited layer of SiN was plotted as a function of post-treatment time.

The stress and the hydrogen content of each final, 50 nm SiN layer were measured, and the results are plotted in the graphs of FIGS. 8 and 9.

FIG. 8 contains a graph in which measured stress (in units of $10^9$ dynes/cm$^2$) was plotted as a function of the number of SiN sublayers deposited at each of four RF stations. As indicated in FIG. 8, the measured compressive stress value increased slightly with increasing post-treatment time with only one SiN sublayer deposited on each of four RF stations (i.e., total of four SiN sublayers). Also, the measured compressive stress increased slightly as the number of SiN sublayers deposited per station increased, even without plasma post-treatment. The results clearly show, however, that a substantial increase in compressive stress was obtained by both increasing the number of SiN sublayers deposited and post-treating each sublayer in the Si-free nitrogen-hydrogen-containing plasma for four seconds. Thus, by depositing eight SiN sublayers on a substrate wafer at each of four RF stations (for a total of 32 SiN sublayers) and conducting a plasma post-treatment of each SiN sublayer in accordance with the invention before depositing the next SiN sublayer, a SiN layer having a thickness of 50 nm and a compressive stress of approximately −2.1×10$^{10}$ dynes/cm$^2$ was formed.

FIG. 9 contains a graph in which the atomic percentage of hydrogen in the final deposited layer of SiN was plotted as a function of post-treatment time. FIG. 9 indicates that the total hydrogen content of the film increased with increasing number of layers and with increased post-treatment time. This suggests that increased hydrogen content results in a more compact film, with higher compressive stress.

The particular systems, designs, methods and compositions described herein are intended to illustrate the functionality and versatility of the invention, but should not be construed to be limited to those particular embodiments. Methods in accordance with the invention are useful in a wide variety of circumstances and applications to conduct PECVD deposition of SiN onto a substrate surface. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

What is claimed is:

1. A PMOS transistor, comprising:
   a PMOS transistor structure on a substrate comprising a gate, p-doped source and drain regions on either side of said gate, and a channel underlying said gate;
   a salicide layer covering said source and drain regions; and
   a dielectric capping layer covering said salicide layer, said dielectric capping layer formed by steps comprising:
   (a) providing in a vacuum chamber a deposition reactant mixture comprising A1 atoms of a chemical element A1 and A2 atoms of a chemical element A2, wherein said element A2 is more electronegative than said element A1, and wherein said A1 atoms have a positive oxidation state and said A2 atoms have a negative oxidation state when A1 atoms are bonded with A2 atoms;
   (b) applying high-frequency (HF) and low-frequency (LF) power to said deposition reactant mixture to generate a deposition plasma containing excited A1-species and excited A2-species;
   (c) depositing a dielectric sublayer on said substrate using said deposition plasma, said dielectric sublayer covering said salicide layer;
   (d) providing a post-treatment gas containing peening species to a vacuum chamber, said post-treatment gas being substantially free of at least one type of atoms selected from the group consisting of A1-type atoms and A2-type atoms;

(e) applying HF and LF power to said post-treatment gas to generate a post-treatment plasma, said post-treatment plasma comprising excited peening species, and said post-treatment plasma being substantially free of at least one type of atoms selected from the group consisting of A1-type atoms and A2-type atoms;

(f) post-treating said dielectric sublayer in said post-treatment plasma; and (g) repeating said steps (c) and (f) of depositing a dielectric sublayer and post-treating said dielectric sublayer until a desired thickness of dielectric material is achieved to form said dielectric capping layer.

2. A PMOS transistor as in claim 1 wherein said applying HF and LF power to said deposition reactant mixture comprises applying LF power greater than said HF power.

3. A PMOS transistor as in claim 1 wherein said applying HF and LF power to said post-treatment gas comprises applying LF power greater than said HF power.

4. A PMOS transistor as in claim 1 wherein said A1 element is selected from a group consisting of silicon (Si), boron (B), and carbon (C), and said A2 element is selected from a group consisting of nitrogen (N), carbon (C), and oxygen (O).

5. A PMOS transistor as in claim 4 wherein said dielectric material comprises a dielectric material selected from the group consisting of silicon nitride, silicon carbide, nitrogen-doped silicon carbide, boron nitride, silicon boron nitride, boron carbide, silicon boron carbide, carbon nitride, silicon oxide, and oxygen-doped silicon carbide.

6. A PMOS transistor as in claim 1 wherein said providing a deposition reactant mixture further comprises:
providing an inert gas in said vacuum chamber.

7. A PMOS transistor as in claim 1 wherein said providing a deposition reactant mixture further comprises:
providing peening species in said vacuum chamber.

8. A PMOS transistor as in claim 1 wherein said providing a deposition reactant mixture comprises:
flowing into said vacuum chamber a silicon-containing species and a nitrogen-containing species.

9. A PMOS transistor as in claim 8 wherein said providing a deposition reactant mixture comprises:
flowing a silicon-containing species selected from the group consisting of tetramethylsilane, tetraethylsilane, and silane.

10. A PMOS transistor as in claim 8 wherein said providing a deposition reactant mixture comprises:
flowing ammonia ($NH_3$) into said vacuum chamber.

11. A PMOS transistor as in claim 8 wherein said providing a post-treatment gas containing peening species comprises:
flowing ammonia ($NH_3$).

12. A PMOS transistor as in claim 1 wherein said providing a post-treatment gas containing peening species comprises:
providing a post-treatment gas containing hydrogen atoms.

13. A PMOS transistor as in claim 1 wherein said providing a post-treatment gas containing peening species comprises:
providing a post-treatment gas containing A2 atoms and not containing A1 atoms.

14. A PMOS transistor as in claim 1 wherein said providing a post-treatment gas containing peening species comprises:
providing a post-treatment gas containing A1 atoms and not containing A2 atoms.

15. A PMOS transistor as in claim 1 wherein said providing a post-treatment gas further comprises:
providing an inert gas in said vacuum chamber.

16. A PMOS transistor as in claim 1 wherein said repeating said steps (c) and (f) of depositing a dielectric sublayer and post-treating said dielectric sublayer comprises:
repeating said processes to form a plurality of dielectric sublayers on said substrate, said plurality being in a range of about from 12 to 40 dielectric sublayers.

17. A PMOS transistor as in claim 1 wherein said post-treating said dielectric sublayer in said post-treatment plasma comprises:
exposing said dielectric sublayer to said post-treatment plasma for a sublayer post-treatment time in a range of about from 0.5 second to 10 seconds.

18. A PMOS transistor as in claim 1 wherein said depositing a dielectric sublayer comprises:
depositing a dielectric sublayer having a thickness in a range of about from 0.5 nm to 20 nm.

19. A PMOS transistor as in claim 1 wherein:
said depositing a dielectric sublayer in step (c) comprises depositing a dielectric sublayer directly on said salicide layer; and
said repeating said steps (c) and (f) of depositing a dielectric sublayer and post-treating said dielectric sublayer forms a dielectric capping layer directly on said salicide layer.

20. A PMOS transistor as in claim 1 wherein:
said dielectric capping layer has compressive stress.

21. A PMOS transistor, comprising:
a PMOS transistor structure on a substrate comprising a gate, p-doped source and drain regions on either side of said gate, and a channel underlying said gate;
a salicide layer covering said source and drain regions; and
a dielectric capping layer having compressive stress covering said salicide layer, said dielectric capping layer formed by steps comprising:

(a) providing in a vacuum chamber a deposition reactant mixture comprising A1 atoms of a chemical element A1 and A2 atoms of a chemical element A2, wherein said element A2 is more electronegative than said element A1, and wherein said A1 atoms have a positive oxidation state and said A2 atoms have a negative oxidation state when A1 atoms are bonded with A2 atoms;

(b) applying high-frequency (HF) and low-frequency (LF) power to said deposition reactant mixture to generate a deposition plasma containing excited A1-species and excited A2-species;

(c) depositing a dielectric layer on said substrate using said deposition plasma, said dielectric layer covering said salicide layer;

(d) providing a post-treatment gas containing peening species to a vacuum chamber, said post-treatment gas being substantially free of at least one type of atoms selected from the group consisting of A1-type atoms and A2-type atoms;

(e) applying HF and LF power to said post-treatment gas to generate a post-treatment plasma, said post-treatment plasma comprising excited peening species, and said post-treatment plasma being substantially free of at least one type of atoms selected from the group consisting of A1-type atoms and A2-type atoms; and (f) post-treating said dielectric layer in said post-treatment plasma to form said dielectric capping layer having compressive stress covering said salicide layer.

22. A PMOS transistor as in claim 21 wherein:
said depositing a dielectric layer in step (c) comprises depositing a dielectric layer directly on said salicide layer.

23. A transistor containing a dielectric layer and located on an integrated circuit substrate, said dielectric layer formed by steps comprising:
(a) providing in a vacuum chamber a deposition reactant mixture comprising A1 atoms of a chemical element A1 and A2 atoms of a chemical element A2, wherein said element A2 is more electronegative than said element A1, and wherein said A1 atoms have a positive oxidation state and said A2 atoms have a negative oxidation state when A1 atoms are bonded with A2 atoms;
(b) applying high-frequency (HF) and low-frequency (LF) power to said deposition reactant mixture to generate a deposition plasma containing excited A1-species and excited A2-species;
(c) depositing a dielectric sublayer on said integrated circuit substrate using said deposition plasma;
(d) providing a post-treatment gas containing peening species to a vacuum chamber, said post-treatment gas being substantially free of at least one type of atoms selected from the group consisting of A1-type atoms and A2-type atoms;
(e) applying HF and LF power to said post-treatment gas to generate a post-treatment plasma, said post-treatment plasma comprising excited peening species, and said post-treatment plasma being substantially free of at least one type of atoms selected from the group consisting of A1-type atoms and A2-type atoms;
(f) post-treating said dielectric sublayer in said post-treatment plasma; and
(g) repeating said processes (c) and (f) of depositing a dielectric sublayer and post-treating said dielectric sublayer until a desired thickness of dielectric material is achieved.

24. A transistor containing a dielectric layer and located on an integrated circuit substrate, said dielectric layer formed by steps comprising:
(a) providing in a vacuum chamber a deposition reactant mixture comprising A1 atoms of a chemical element A1 and A2 atoms of a chemical element A2, wherein said element A2 is more electronegative than said element A1, and wherein said A1 atoms have a positive oxidation state and said A2 atoms have a negative oxidation state when A1 atoms are bonded with A2 atoms;
(b) applying high-frequency (HF) and low-frequency (LF) power to said deposition reactant mixture to generate a deposition plasma containing excited A1-species and excited A2-species;
(c) depositing a dielectric layer on said integrated circuit substrate using said deposition plasma;
(d) providing a post-treatment gas containing peening species to a vacuum chamber, said post-treatment gas being substantially free of at least one type of atoms selected from the group consisting of A1-type atoms and A2-type atoms;
(e) applying HF and LF power to said post-treatment gas to generate a post-treatment plasma, said post-treatment plasma comprising excited peening species, and said post-treatment plasma being substantially free of at least one type of atoms selected from the group consisting of A1-type atoms and A2-type atoms; and
post-treating said dielectric layer in said post-treatment plasma.

* * * * *